United States Patent [19]
Urano et al.

[11] Patent Number: 5,671,148
[45] Date of Patent: Sep. 23, 1997

[54] APPARATUS AND METHOD FOR CHECKING LOGIC CIRCUIT

[75] Inventors: Maho Urano; Miho Yokota, both of Tokyo, Japan

[73] Assignee: Mitsubishi Denki Kabushiki Kaisha, Tokyo, Japan

[21] Appl. No.: 562,846

[22] Filed: Nov. 27, 1995

[30] Foreign Application Priority Data

Jul. 11, 1995 [JP] Japan ................................ 7-174910

[51] Int. Cl.⁶ .................................................... H03K 17/60
[52] U.S. Cl. ........................ 364/482; 364/489; 364/578
[58] Field of Search ................................ 364/482, 488, 364/489, 496, 491, 578

[56] References Cited

U.S. PATENT DOCUMENTS

| | | | |
|---|---|---|---|
| 4,453,089 | 6/1984 | Shuey et al. ........................... | 307/253 |
| 4,586,004 | 4/1986 | Valder .................................... | 330/300 |
| 4,829,415 | 5/1989 | Haferl .................................... | 363/26 |
| 4,924,430 | 5/1990 | Zasio et al. ............................ | 364/578 |
| 5,223,733 | 6/1993 | Doi et al. ............................... | 257/386 |
| 5,295,088 | 3/1994 | Hartoog et al. ....................... | 364/578 |
| 5,473,548 | 12/1995 | Omori et al. .......................... | 364/489 |

OTHER PUBLICATIONS

Solid State Pulse Circuits 2nd-ed., David A. Bell, Reston Pub Co., 1981 pp. 8-11 + 98-107.

*Primary Examiner*—James P. Trammell
*Assistant Examiner*—Craig Steven Miller
*Attorney, Agent, or Firm*—Leydig, Voit & Mayer

[57] ABSTRACT

An apparatus and method for checking logic circuit checks logic element influenced by hot carriers in the logic circuit. The present invention comprises means for measuring rising transition time $t_r$ (or falling transition time $t_f$) of signal generated by logic element comprising one portion of the logic circuit; means for calculating a ratio (DUTY) of rising transition time $t_r$ (or falling transition time $t_f$) and operation period T of the signal; and means for comparing said DUTY with maximum allowable duty (DUTYMAX), in order to detect the logic element having DUTY exceeding maximum allowable duty (DUTYMAX).

16 Claims, 10 Drawing Sheets

$$Cout = \sum_{1}^{n} Ci + \sum_{1}^{n} Cpi$$

APPARATUS AND METHOD FOR CHECKING LOGIC CIRCUIT

BACKGROUND OF THE INVENTION

1. Field of the invention

The invention relates to an apparatus and a method for checking hot carriers which are generated in a logic element.

2. Description of the Prior Art

Recently, portions of Integrated Circuit (IC) has been miniaturized along with high integration of MOSLSI. As a result, in the case of n-channel MOSFETs, for instance, since the electric field of the n-channel layer becomes high because of miniaturization, hot carriers are generated where electrons and holes are separated from each other by collision ionization in the n-channel. Most of the electrons of these hot carriers are absorbed in a drain, and a part of them is injected into a gate oxide film to change electrical characteristics of MOSFET.

On the other hand, in case of a floating gate where type MOS memory gate, electrode are not connected to the outside, injected electrons are stored in a gate electrode, thereby causing "soft error" failure. Especially, as the load connected to the logic circuit increases, a larger current flows through the logic circuit. This gives an undesirably magnified effect to the hot carriers, which causes the soft errors of the MOSFET to increase, and causes characteristics of MOSFET to change widely. In an extreme case, it is possible to cause a great deal of damage to MOSFET. Therefore, it is important to detect these hot carriers in advance, and then to make an appropriate circuit design.

None of the conventional logic circuits, however, are designed by detecting the hot carriers and then assuming that the hot carriers exceed a predetermined amount. The conventional logic circuits are designed under the assumption of electronmigration. Electronmigration refers to a phenomenon in the integrated circuit where metallic electrons get kinetic energy and move toward the direction of the current which flows in the metallic thin film wire after electrons collide to the metallic electrons. The electronmigration causes a problem such that the metallic electrons move from a part of small flow velocity to a part of faster flow velocity of the metallic thin film wire to break the wire. The conventional method assumes this type of failure caused by the electronmigration in advance if capacitance exceeds a predetermined threshold when the load capacitance connected to the logic element is measured.

Figure 9:
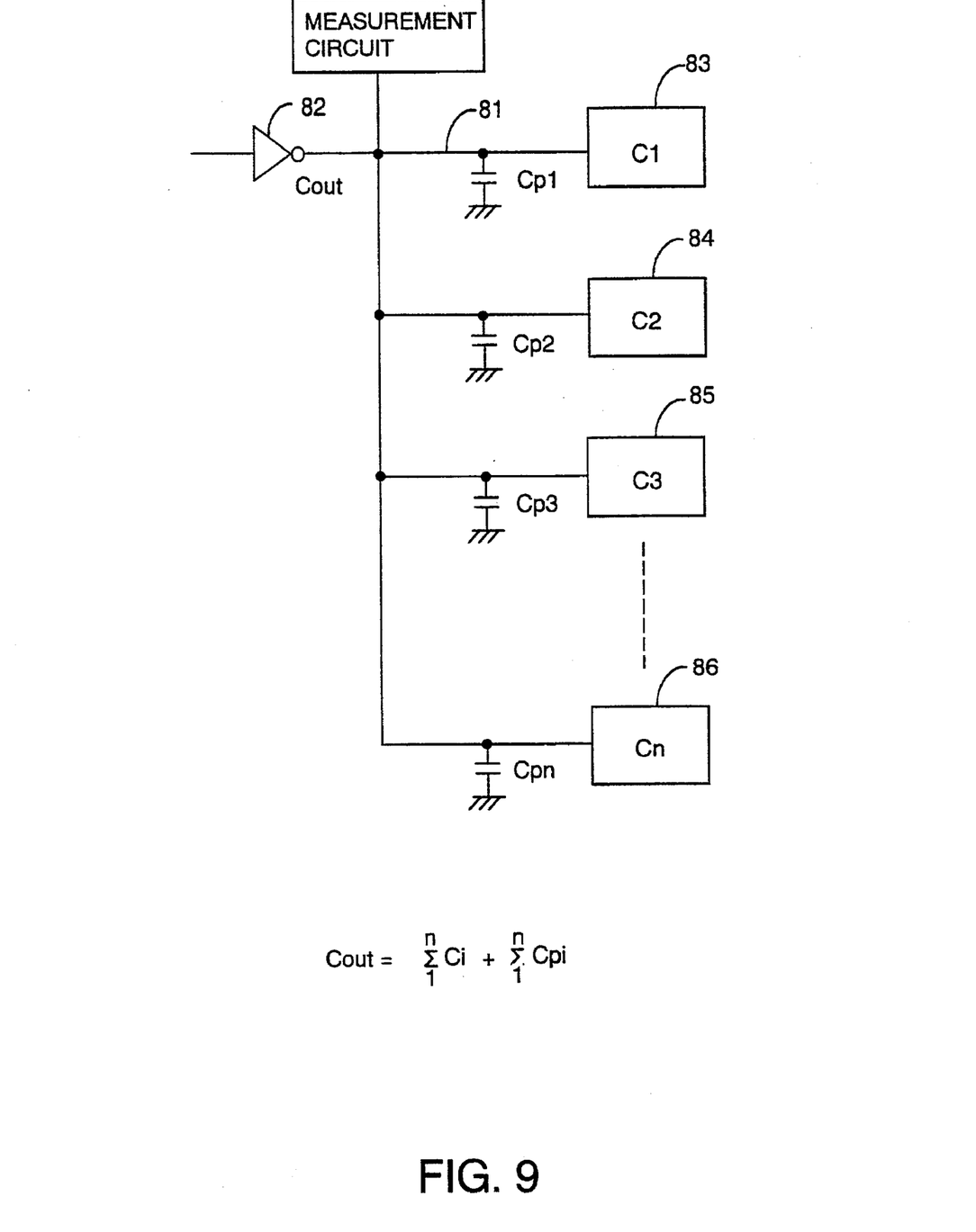
FIG. 9 shows a circuit for checking electronmigration in the conventional logic circuit.

FIG. 9 shows an example of a conventional method for checking the electronmigration in the logic circuit. In FIG. 9, this checking system comprises a logic element 82, which drives an output side signal line 81, and Cout which represents total capacitance of loads when viewing the signal line 81 from the logic element 82. A plurality of loads 83–86 having capacitance of C1, C2, ... Cn, respectively, are connected to the logic element 82. The loads 83–86 have respective floating capacitances Cp1, Cp2, ... Cpn. The total capacitance Cout ($=\Sigma Ci+\Sigma Cpi$) becomes a load capacitance of logic element 82.

Figure 10:
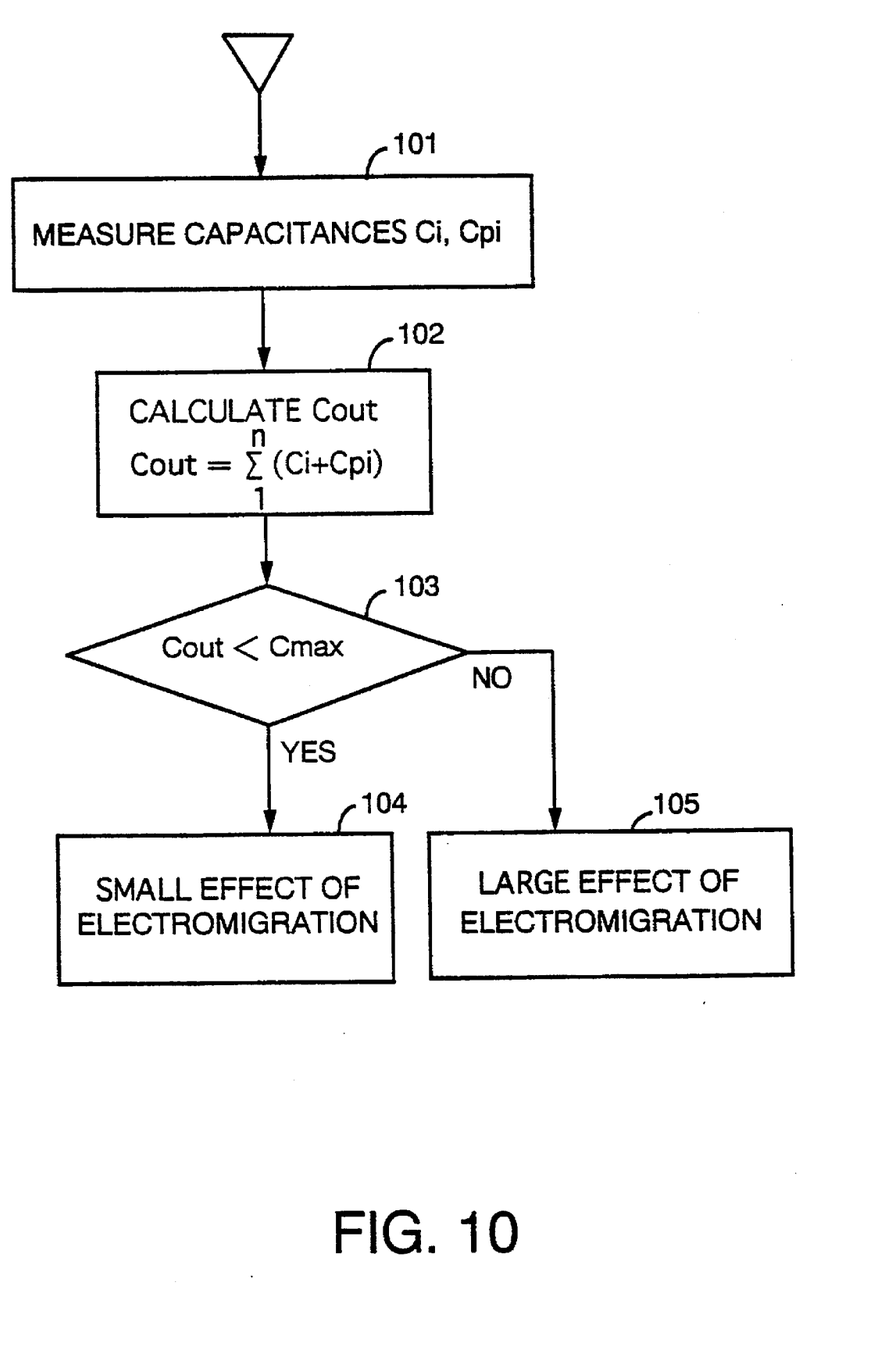
FIG. 10 shows a conventional flow chart for checking electronmigration in the logic circuit.

FIG. 10 shows a conventional flow chart for checking the electronmigration in the logic circuit. The conventional electronmigration check system applied to the logic circuit will be explained using FIG. 10. First, in step 101, respective capacitances C1, C2, ... Cn connected to signal line 81 are measured, then respective floating capacitances Cp1, Cp2, ... Cpn of all loads 83–86 are measured. In step 102, the total capacitance Cout ($=\Sigma Ci+\Sigma Cpi$) is calculated. In step 103, the total capacitance Cout is compared with specific maximum load capacitance Cmax of logic element 82, and a condition Cout<Cmax is judged. If the comparison result shows Cout<Cmax, it is judged that the electronmigration has a small effect on logic element 82. If the comparison result shows Cout>Cmax, then it is judged that the electronmigration has a large effect on logic element 82.

Although the conventional electronmigration check apparatus mentioned above can detect the logic element influenced by the electronmigration where the metallic electrons moves in the high electric field, it is unable to detect the logic element influenced by the hot carriers generated from the miniaturized circuit.

SUMMARY OF THE INVENTION

It is an object of the present invention to check and select logic elements in which hot carriers may be generated by means of calculating DUTY and comparing the DUTY with maximum allowable duty (DUTYMAX).

According to one aspect of the invention, the apparatus for checking logic circuit comprises means for measuring rising transition time $t_r$ (or falling transition time $t_f$) of a signal generated by logic element comprising one portion of the logic circuit; means for calculating a ratio (DUTY) of rising transition time $t_r$ (or falling transition time $t_f$) and operation period T of the signal; and means for comparing said DUTY with maximum allowable duty (DUTYMAX), wherein, if the comparison result is DUTY<DUTYMAX, it is judged that hot carriers have a small effect on the logic element, and if the comparison result is DUTY>DUTYMAX, it is judged that hot carriers have a large effect on the logic element.

According to another aspect of the invention, the apparatus for checking logic circuit comprises a transition time measuring means which measures total capacitance Cout of loads driven by the logic element, and calculates the rising transition time $t_r$ (or the falling transition time $t_f$) of the signal generated by the logic element by the following formula: $t_r=t+k\times Cout$, using the measured Cout, where, t and k denote specific parameters of the logic element.

According to another aspect of the invention, the apparatus for checking logic circuit comprises a transition time measuring means which measures total capacitance Cout of loads driven by the logic element, and calculates the rising transition time $t_r$ (or the falling transition time $t_f$) of the signal generated by the logic element by the following formula: $t_r=tx+kx \times Cout$ using the measured Cout.

According to another aspect of the invention, the present invention comprises transition time measuring means which measures total capacitance Cout of loads driven by the logic element and a drive coefficient K of the logic element in the precedent stage, and calculates rising transition time $t_r$ (or the falling transition time $t_f$) of the signal generated by the logic element by the following formula using the measured Cout and drive coefficient K: $tr=tx+kx\times Cout\times K$.

According to another aspect of the invention, the present invention comprises a means for changing the maximum allowable duty DUTYMAX into an appropriate value in response to whether said signal line driven by the logic element is data or clock.

According to another aspect of the invention, the present invention comprises means for measuring capacitance Ci and Cpi of each load driven by the logic element; means for calculating total capacitance Cout ($\Sigma Ci+\Sigma Cpi$) of these loads; means for comparing said calculated Cout with maximum allowable capacitance Cmax; means for measuring rising transition time $t_r$ (or falling transition time $t_f$) of signal generated by logic element comprising one of the logic circuit; means for calculating a ratio (DUTY) of rising transition time $t_r$ (or falling transition time $t_f$) and operation period T of the signal; and means for comparing said DUTY with maximum allowable duty (DUTYMAX) for logic elements where Cout exceeds the maximum allowable capacitance Cmax; wherein, if the comparison result is DUTY<DUTYMAX, it is judged that hot carriers have a small effect on the logic element and if the comparison result is DUTY>DUTYMAX, it is judged that hot carriers a large effect on the logic element.

According to another aspect of the invention, the present invention comprises means for measuring $t_{ri}$ and $t_{fi}$ of the signal applied to the signal line; means for calculating $\Sigma t_{ri}$, the total of the transition time; means for calculating $\Sigma t_{fi}$, the total of the transition time; means for measuring period T of the signal directly or assigning value of period T of a predetermined signal; means for calculating DUTY by a following formula: DUTY=$(\Sigma t_{ri}+\Sigma t_{fi})/2T$; and means for comparing DUTY with a specific maximum duty DUTYMAX of the logic element; wherein, if the comparison result is DUTY<DUTYMAX, it is judged that hot carriers have a small effect on the logic element and if the comparison result is DUTY>DUTYMAX, it is judged that hot carriers have a large effect on the logic element.

According to another aspect of the invention, the present invention comprises means for measuring respective capacitances Ci and Cpi of the loads of the logic element; means for calculating total capacitance Cout ($\Sigma$Ci +$\Sigma$Cpi) of said loads; means for comparing said calculated Cout with maximum allowable capacitance Cmax; means for measuring $t_{ri}$ and $t_{fi}$ of said signal applied to the signal line; means for measuring total rising transition time $\Sigma t_{ri}$; means for measuring total falling transition time $\Sigma t_{fi}$; means for measuring directly said period T of the signal or assigning value of period T of a predetermined signal; means for calculating DUTY by a following formula: DUTY=$(\Sigma t_{ri}+\Sigma t_{fi})/2T$, means for comparing DUTY with a specific maximum duty DUTYMAX of the logic element; wherein, if the comparison result is DUTY<DUTYMAX, it is judged that hot carriers have a small effect on the logic element and if the comparison result is DUTY>DUTYMAX, it is judged that hot carriers have give a large effect on the logic element.

DETAILED DESCRIPTION OF THE PREFERRED EMBODIMENTS

Embodiment 1

Figure 1:
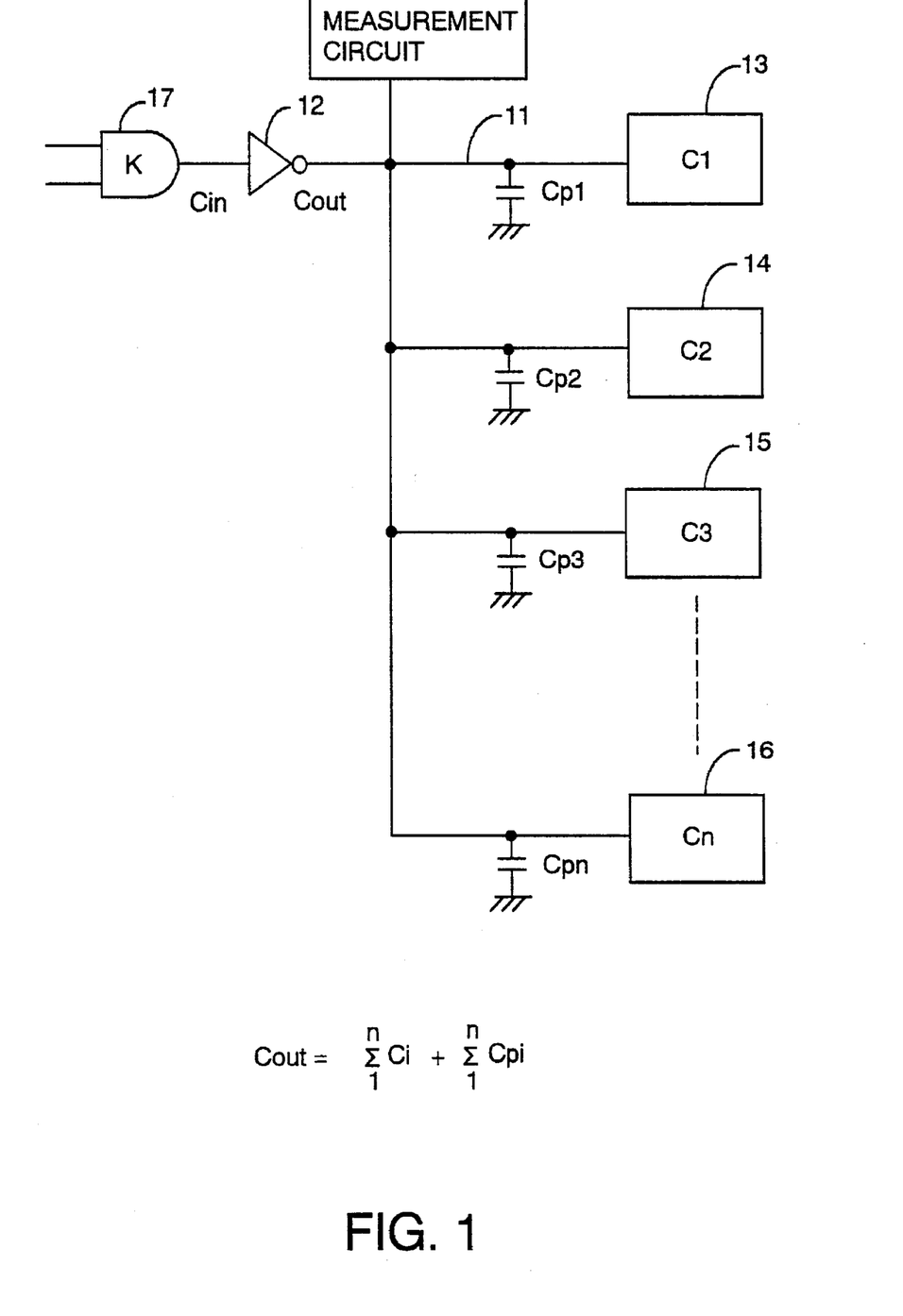
FIG. 1 shows a circuit for checking hot carriers of an embodiment of the present invention.

FIG. 1 shows a circuit for checking hot carriers of an embodiment of the present invention. In FIG. 1, this checking system comprises a logic element 12, which drives an output side signal line 11, and Cout represents total capacitance of loads when viewing the signal line 11 from the logic element 12. A plurality of loads 13~16 having capacitance of C1, C2, . . . Cn, respectively, are connected to the logic element 12. The loads 13~16 have respective floating capacitances Cp1, Cp2, . . . Cpn. The total capacitance Cout (=$\Sigma$Ci+$\Sigma$Cpi) becomes a load capacitance of logic element 12.

Figure 2:
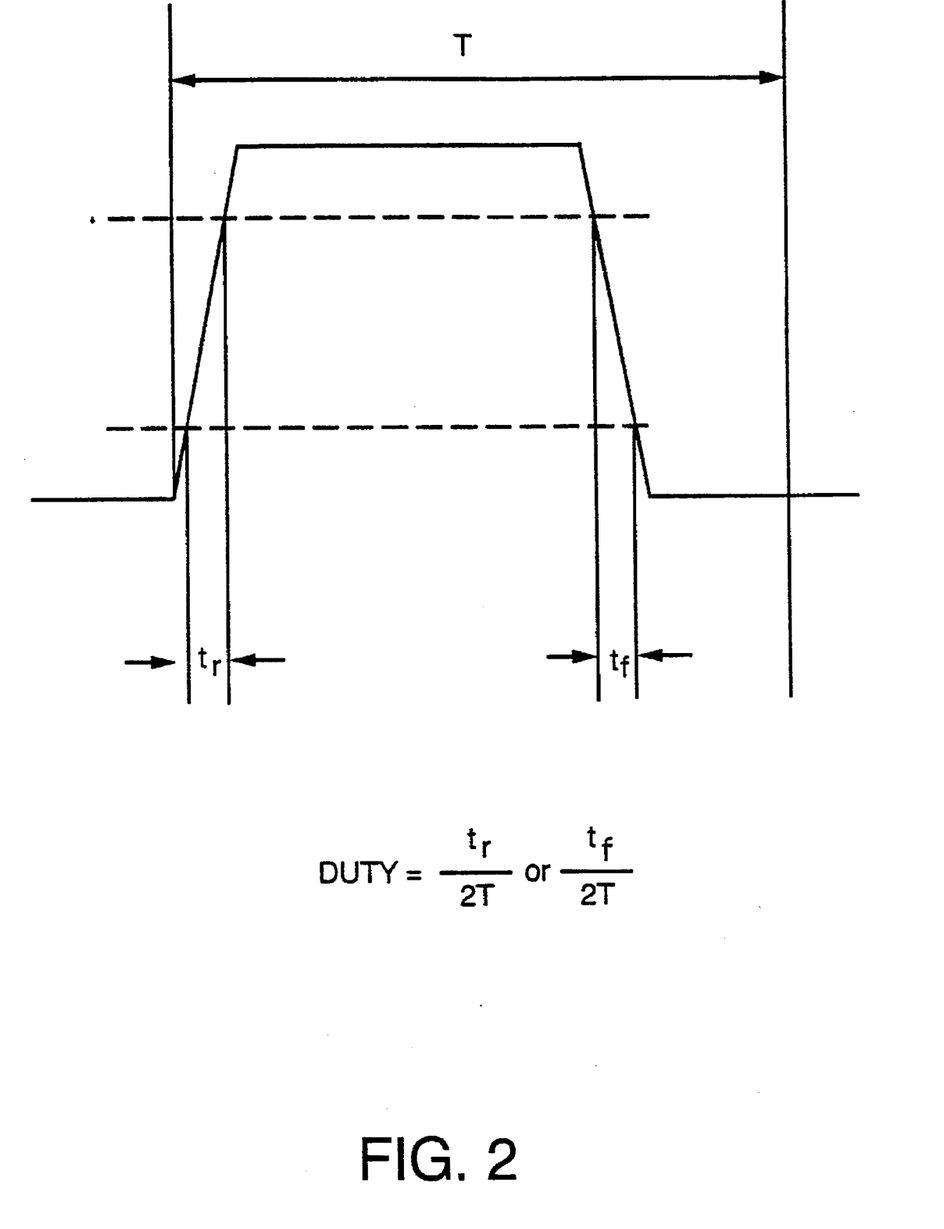
FIG. 2 shows a method for calculating DUTY of the present invention.

FIG. 2 shows a method for calculating DUTY of the present invention. In FIG. 2, DUTY is defined by formula (1):

$$\text{DUTY}=t_r/2T$$

$$\text{or DUTY}=t_f/2T \qquad (1)$$

where, $t_r$ is a rising transition time of signal waveform, $t_f$ is a failing transition time of signal waveform, and T is an operation period of the signal.

When the hot carriers are generated in logic element 12, delay times $t_r$ and $t_f$ become larger by physical phenomenon as shown in FIG. 2. Therefore, it is possible to assume whether the hot carriers are generated or not in logic element 12 by measuring $t_r$ or $t_f$.

Figure 3:
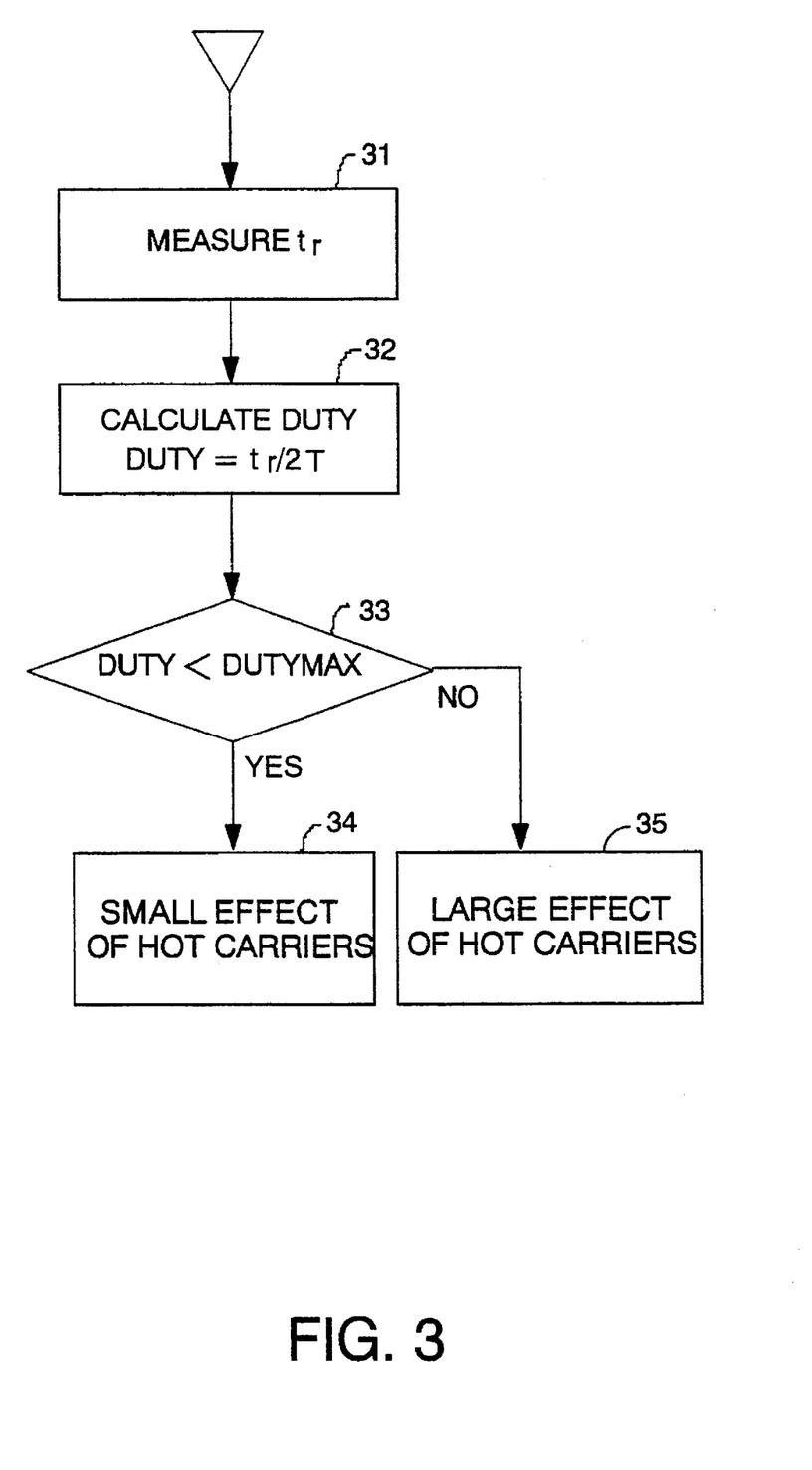
FIG. 3 shows a flow chart for checking hot carriers of a first embodiment of the present invention.

FIG. 3 shows a flow chart for checking hot carriers of a first embodiment of the present invention. Rising transition time $t_r$ of the signal, which is applied to signal line 11, is measured in step 31 in FIG. 3. In step 32, DUTY is calculated based on formula (1). In step 33, DUTY is compared with specific maximum duty (DUTYMAX) of logic element 12, and condition of DUTY<DUTYMAX is judged. If comparison result is DUTY<DUTYMAX, it is judged that the hot carriers have a small effect on logic element 12. And if comparison result is DUTY>DUTYMAX, it is judged the hot carriers have a large effect on logic element 12. Where, DUTYMAX is a reference value and depends on characteristics of the transistor, which that is an indication of a condition in which the hot carriers are generated, that is, a rate of operation time in which more than a certain voltage is caused at the gate of the transistor.

Embodiment 2

Furthermore, a relationship between total load capacitance Cout and rising transition time $t_r$ is given as following formula (2):

$$t_r=t+k\times\text{Cout} \qquad (2)$$

where, t and k denote specific parameters of logic element 12. Therefore, it is possible to calculate rising transition time $t_r$ by measuring the total load capacitance Cout.

Embodiment 3

Furthermore, a relationship between total load capacitance Cout and rising transition time $t_r$ is given as following formula (3):

$$t_r = tx + kx \times Cout \tag{3}$$

where, tx and kx denote parameters, which change in response to input capacitance Cin of logic element 12 as follow.

$$tx = t1, kx = k1: \quad 0 < Cin < C1$$
$$tx = t2, kx = k2: \quad C1 < Cin < C2$$
$$tx = t3, kx = k3: \quad C2 < Cin < C3$$
$$\cdot$$
$$\cdot$$
$$\cdot$$
$$tx = ti, kx = ki: \quad C_{i-1} < Cin < Ci$$
$$\cdot$$
$$\cdot$$
$$\cdot$$
$$tx = tn, kx = kn: \quad Cn < Cin$$

In the above formula, since parameters tx and kx changes non-linearly with respect to Cin, parameters tx and kx are divided into several portions according to the value of Cin in order to make a linear approximation. Therefore, it is possible to calculate rising transition time $t_r$ by measuring the total load capacitance Cout.

Embodiment 4

Furthermore, it is possible to obtain relationship between total load capacitance Cout and rising transition time $t_r$ as represented by formula (4), considering drive coefficient K of logic element 17 of the preceding stage:

$$t_r = tx + kx \times Cout \times K(ns) \tag{4}$$

where, a drive coefficient K of logic element 17 is a specific value determined by each transistor and tx and kx denote parameters which are the same as those defined in the second embodiment. In this case, it is possible to calculate the rising transition time $t_r$ by measuring total load capacitance Cout and specific drive coefficient K of logic element 17.

Embodiment 5

Figure 4:
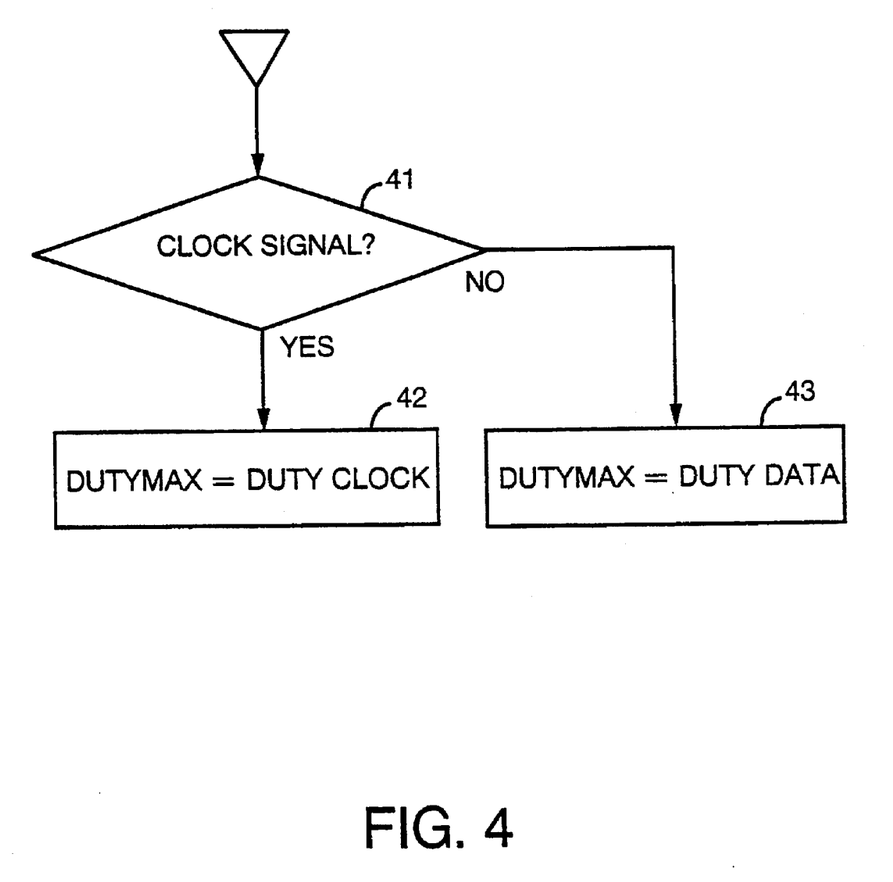
FIG. 4 shows a flow chart for changing maximum allowable duty (DUTYMAX) of a logic element.

Furthermore, FIG. 4 shows a flow chart for changing maximum allowable duty (DUTYMAX) of a logic element 12. In FIG. 4, the signal line 11 driven by logic element 12 is judged whether it is a data type or a clock type, then the maximum allowable duty (DUTYMAX) is changed according to the judgement result. It means that signals on the clock signal line change by twice changing rates (voltage change) rather than signals on the data signal line during the same operation period. Therefore, selection of appropriate value of DUTYMAX for clock signal or data signal makes more accurate checking system.

Embodiment 6

Figure 5:
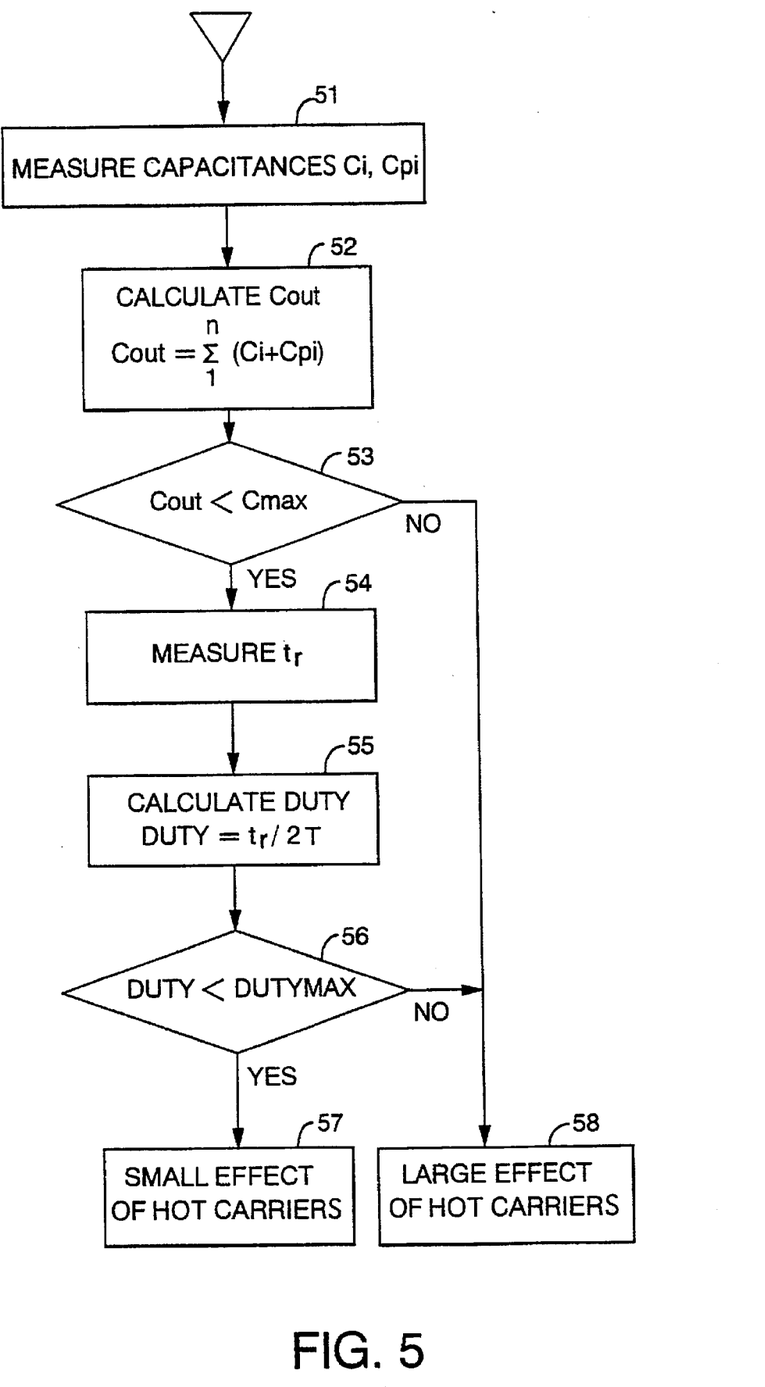
FIG. 5 shows a flow chart for checking hot carriers of a sixth embodiment of the present invention.

FIG. 5 shows a flow chart for checking hot carriers of a sixth embodiment of the present invention. It provides a more accurate checking system by adding steps for measuring the rising transition time $t_r$ to the conventional steps for checking total load capacitance Cout.

The sixth embodiment of the present invention is explained using FIG. 5. First, in step 51, all capacitances C1, C2, ... Cn connected to signal line 11 are measured and all floating capacitances Cp1, Cp2, ... Cpn are also measured. In step 52, the total capacitances Cout (=ΣCi+ΣCpi) is calculated. In step 53, total capacitance Cout is compared with specific maximum load capacitance Cmax of logic element 12, and the condition Cout<Cmax is judged. If comparison result is Cout>Cmax, it is judged that the hot carriers have a large effect on logic element 12.

Next, if the comparison result is Cout<Cmax, rising transition time $t_r$ of signal to be applied to signal line 11 is measured in step 54. In step 55, DUTY is calculated based on formula (1). In step 56, DUTY is compared with specific maximum duty (DUTYMAX) of logic element 12, and the condition DUTY<DUTYMAX is judged. If the comparison result is DUTY<DUTYMAX, it is judged that the hot carriers have a small effect on logic element 12. And, if the comparison result is DUTY>DUTYMAX, it is judged that the hot carriers have a large effect on logic element 12. Where, DUTYMAX is a reference value and depends on characteristics of the transistor, that is an indication of a condition in which the hot carriers are generated, that is, a rate of operation time in which more than a certain voltage is caused at the gate of the transistor.

Embodiment 7

Figure 6:
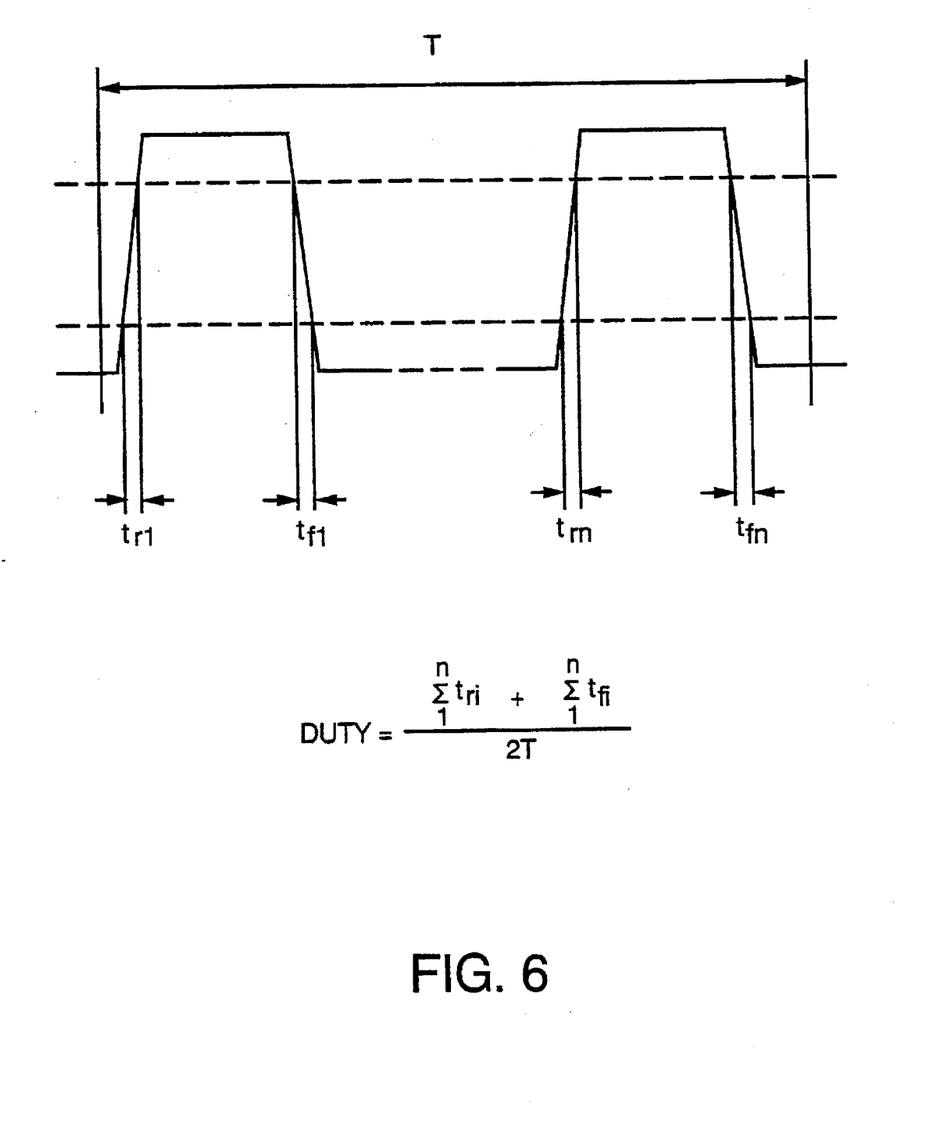
FIG. 6 shows another method for calculating DUTY of the present invention.

FIG. 6 shows another method for calculating DUTY of the present invention. In FIG. 6, $t_{r1}$ and $t_{f1}$ are a rising transition time and a falling transition time of the first signal waveform, respectively, and $t_{rn}$ and $t_{fn}$ are those of the n-th signal waveform, respectively, and T is an operation period of the signal. Another method for calculating DUTY is defined by formula (5):

$$DUTY = (\Sigma t_{ri} + \Sigma t_{fi})/2T \tag{5}$$

where, $t_{ri}$ and $t_{fi}$ denote a rising transition time and a falling transition time of i-th signal waveform, respectively, and i=1~n.

Figure 7:
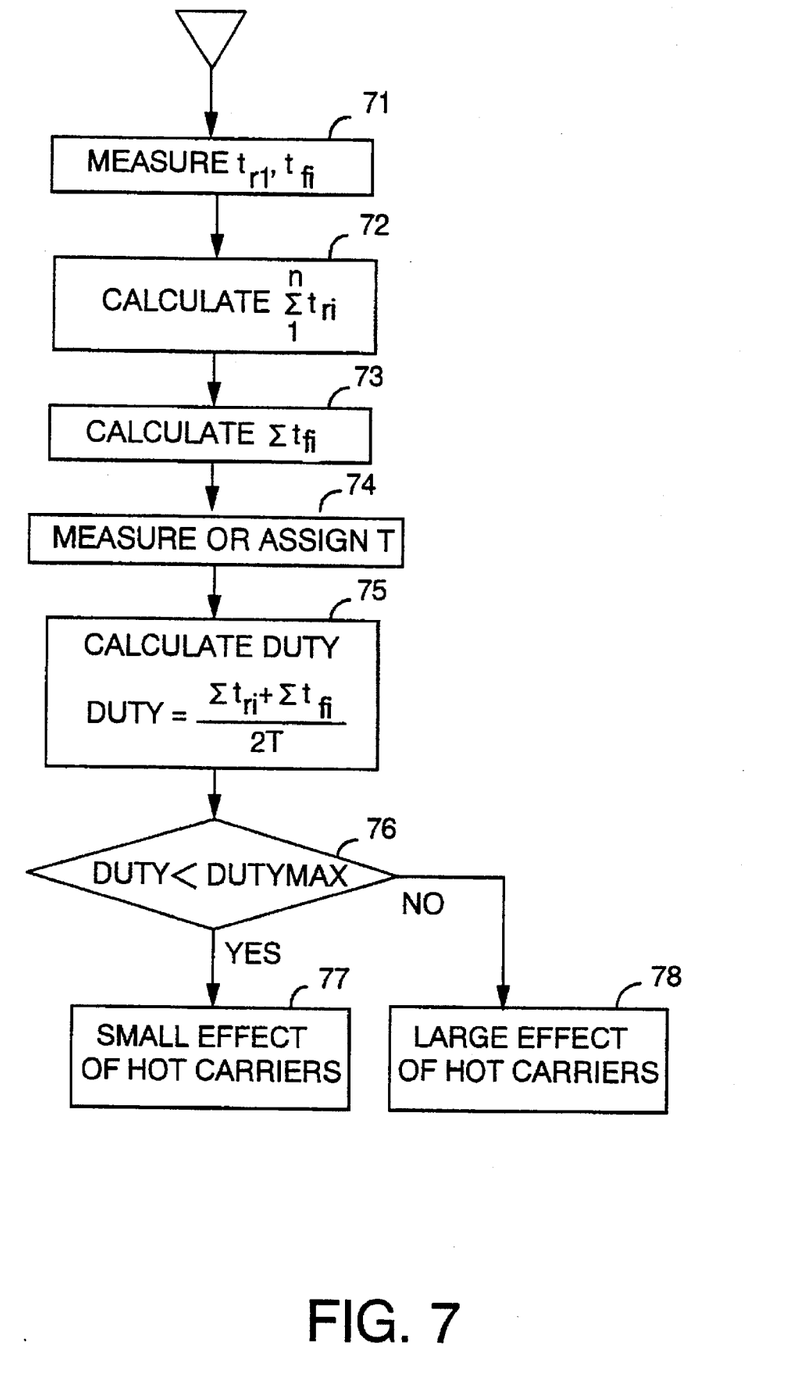
FIG. 7 shows a flow chart for checking hot carriers of a seventh embodiment of the present invention.

FIG. 7 shows a flow chart for checking hot carriers of a seventh embodiment of the present invention. In step 71, a rising transition time $t_{ri}$ and a falling transition time $t_{fi}$ to be applied to signal line 11 are measured. In step 72, summation of the rising transition time $\Sigma t_{ri}$ in formula (5) is calculated. In step 73, summation of the falling transition time $\Sigma t_{fi}$ in formula (5) is calculated. In step 74, a period T of the signal is directly measured, or a period T of the signal is assigned which is determined in advance. In step 75, DUTY in formula (5) is calculated from the summation of the rising transition time $\Sigma t_{ri}$ and the summation of the failing transition time $\Sigma t_{fi}$. In step 76, DUTY is compared with specific maximum duty (DUTYMAX) of logic element 12, and the condition DUTY<DUTYMAX is judged. If the comparison result is DUTY<DUTYMAX, it is judged that the hot carriers have a small effect on logic element 12 (step 77). And, if the comparison result is DUTY>DUTYMAX, it is judged that the hot carriers have a large effect on logic element 12 (step 78).

Embodiment 8

Figure 8:
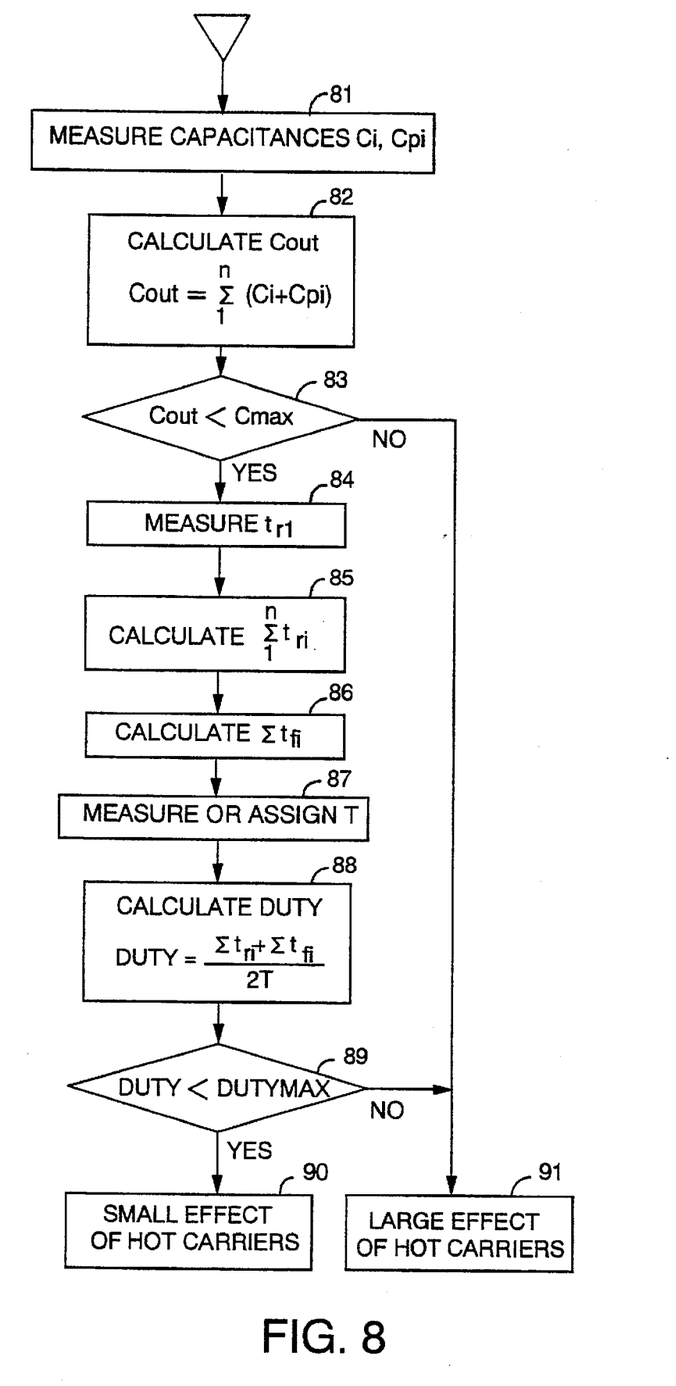
FIG. 8 shows a flow chart for checking hot carriers of a eighth embodiment of the present invention.

FIG. 8 shows a flow chart for checking hot carriers according to an a eighth embodiment of the present invention. FIG. 8 shows a more accurate checking system by adding steps for checking DUTY to the conventional steps for checking total load capacitance Cout. It is comparatively easy to realize this system by adding functions to the conventional checking system.

Next, the eighth embodiment of the present invention is explained using FIG. 8. First, in step 81, all capacitances C1, C2, ... Cn connected to signal line 11 are measured and all floating capacitances Cp1, Cp2, ... Cpn are also measured.

In step 82, the total capacitance Cout (=ΣCi+ΣCpi) is calculated. In step 83, total capacitance Cout is compared with specific maximum load capacitance Cmax of logic element 12, and the condition Cout<Cmax is judged. If comparison result is Cout>Cmax, it is judged that the hot carriers have a large effect on logic element 12.

Next, if the comparison result is Cout<Cmax, rising transition time $t_r$ of signal to be applied to signal line 11 is measured in step 84. In step 85, summation of the rising transition time $\Sigma t_{ri}$ in formula (5) is calculated. In step 86, summation of the falling transition time $\Sigma t_{fi}$ in formula (5) is calculated. In step 87, a period T of the signal is directly measured, or a period T of the signal is assigned which is determined in advance. In step 88, DUTY in formula (5) is calculated from the summation of the rising transition time $\Sigma t_{ri}$ and the summation of the falling transition time $\Sigma t_{fi}$. In step 89, DUTY is compared with specific maximum duty (DUTYMAX) of logic element 12, and the condition DUTY<DUTYMAX is judged. If the comparison result is DUTY<DUTYMAX, it is judged that the hot carriers give a small effect on logic element 12 (step 90). And, if the comparison result is DUTY>DUTYMAX, it is judged that the hot carriers have a large effect on logic element 12 (step 91). According to this method, it is possible to check the hot carriers more accurately, since more accurate value of DUTY can be available.

What is claimed is:

1. An apparatus for checking logic circuit comprising:
   means for measuring rising transition time $t_r$ (or falling transition time $t_f$) of signal generated by logic element comprising one portion of the logic circuit;
   means for calculating a ratio (DUTY) of rising transition time $t_r$ (or falling transition time $t_f$) and operation period T of the signal; and
   means for comparing said DUTY with maximum allowable duty wherein, if the comparison result is DUTY<DUTYMAX, it is judged that hot carriers give a small effect on the logic element, and if the comparison result is DUTY>DUTYMAX, it is judged that hot carriers give a large effect on the logic element.

2. The apparatus for checking logic circuit of claim 1: wherein
   said transition time measuring means measures total capacitance Cout of loads driven by the logic element, and using the measured Cout, and calculates the rising transition time $t_r$ (or the falling transition time $t_f$) of the signal generated by the logic element by the following formula:

$$t_r = t + k \times Cout$$

where, t and k denote specific parameters of the logic element.

3. The apparatus for checking logic circuit of claim 1: wherein
   said transition time measuring means measures total capacitance Cout of loads driven by the logic element, and using the measured Cout, and calculates the rising transition time $t_r$ (or the falling transition time $t_f$) of the signal generated by the logic element by the following formula:

$$t_r = tx + kx \times Cout$$

where, tx and kx are parameters which change by the input capacitance Cin of logic element 12 as follows:

| | |
   |---|---|
   | $tx = t1, kx = k1$: | $0 < Cin < C1$ |
   | $tx = t2, kx = k2$: | $C1 < Cin < C2$ |
   | $tx = t3, kx = k3$: | $C2 < Cin < C3$ |
   | . | |
   | . | |
   | . | |
   | $tx = ti, kx = ki$: | $Ci_{-1} < Cin < Ci$ |
   | . | |
   | . | |
   | . | |
   | $tx = tn, kx = kn$: | $Cn < Cin$. |

4. The apparatus for checking logic circuit of claim 1: wherein
   said transition time measuring means measures total capacitance Cout of loads driven by the logic element and a drive coefficient K of the logic element in the precedent stage, and calculates rising transition time $t_r$ (or the falling transition time $t_f$) of the signal generated by the logic element by the following formula using the measured Cout and drive coefficient K:

$$tr = tx + kx \times Cout \times K$$

where, tx and kx are parameters which change by the input capacitance Cin of the logic element as follows:

| | |
   |---|---|
   | $tx = t1, kx = k1$: | $0 < Cin < C1$ |
   | $tx = t2, kx = k2$: | $C1 < Cin < C2$ |
   | $tx = t3, kx = k3$: | $C2 < Cin < C3$ |
   | . | |
   | . | |
   | . | |
   | $tx = ti, kx = ki$: | $Ci_{-1} < Cin < Ci$ |
   | . | |
   | . | |
   | . | |
   | $tx = tn, kx = kn$: | $Cn < Cin$. |

5. The apparatus for checking logic circuit of claim 1, further comprising:
   means for changing the maximum allowable duty DUTYMAX into an appropriate value in response to whether said signal line driven by the logic element is data or clock.

6. An apparatus for checking logic circuit comprising:
   means for measuring capacitance Ci and Cpi of each load driven by a logic element;
   means for calculating total capacitance Cout (ΣCi+ΣCpi) of these loads;
   means for comparing said calculated Cout with maximum allowable capacitance Cmax;
   means for measuring rising transition time $t_r$ (or falling transition time $t_f$) of signal generated by logic element comprising one of the logic circuit;
   means for calculating a ratio (DUTY) of rising transition time $t_r$ (or falling transition time $t_f$) and operation period T of the signal; and
   means for comparing said DUTY with maximum allowable duty (DUTYMAX) for logic elements where Cout exceeds the maximum allowable capacitance Cmax;
   wherein, if the comparison result is DUTY<DUTYMAX, it is judged that hot carriers give a small effect on the logic element and if the comparison result is DUTY>DUTYMAX, it is judged that hot carriers give a large effect on the logic element.

7. An apparatus for checking logic circuit comprising:

means for measuring $t_{ri}$ and $t_{fi}$ of a signal applied to a signal line;

means for calculating $\Sigma t_{ri}$, defined as a first total transition time;

means for calculating $\Sigma t_{fi}$, defined as a second total transition time;

means for measuring a period T of the signal directly or assigning a value of period T of a predetermined signal;

means for calculating a DUTY by a following formula:

$$DUTY=(\Sigma[t_{ri}]+\Sigma[t_{fi}])/2T;\ \text{and}$$

means for comparing the DUTY with a specific maximum duty DUTYMAX of a logic element;

wherein, if the comparison result is DUTY<DUTYMAX, it is judged that hot have a small effect on the logic element and if the comparison result is DUTY>DUTYMAX, it is judged that hot give a large effect on the logic element.

8. An apparatus for checking a logic circuit, the logic circuit including a logic element coupled to the apparatus by a signal line, a plurality of loads comprising:

means for measuring respective capacitances Ci and Cpi of the plurality of loads of the logic element;

means for calculating total capacitance Cout ($\Sigma Ci+\Sigma Cpi$) of said loads;

means for comparing said calculated Cout with maximum allowable capacitance Cmax;

means for measuring $t_{ri}$ and $t_{fi}$ of a signal applied to the signal line;

means for measuring a first total rising transition time $\Sigma t_{ri}$;

means for measuring a second total falling transition time $\Sigma t_{fi}$;

means for measuring a period T of the signal or assigning a value period T of a predetermined signal;

means for calculating DUTY by a following formula;

$$DUTY=(\Sigma t_{ri}+\Sigma t_{fi})/2T$$

means for comparing DUTY with a specific maximum duty DUTYMAX of the logic element;

wherein, if a comparison result is DUTY<DUTYMAX, it is judged that hot carriers have a small effect on the logic element and if the comparison result is DUTY>DUTYMAX, it is judged that hot carriers give a large effect on the logic element.

9. A method for checking the effects of hot carriers on a logic circuit, the logic circuit including a logic element, said method comprising:

measuring rising transition time $t_r$ or falling transition time $t_f$ of a signal generated by the logic element;

calculating a ratio (DUTY) of rising transition time and an operation period T of the signal; and comparing said DUTY with a maximum allowable duty (DUTYMAX), wherein, if a comparison result is DUTY<DUTYMAX, it is judged that hot carriers have a small effect on the logic element, and if the comparison result is DUTY<DUTYMAX, it is judged that hot carriers have a large effect on the logic element.

10. The method for checking logic circuit of claim 9 wherein said transition time measuring step includes measuring total capacitance Cout of loads driven by the logic element, and calculates the rising transition time $t_r$ or the falling transition time $t_f$ of the signal generated by the logic element by the following formula using the measured Cout:

$$t_r=t+k\times Cout$$

where, t and k denote specific parameters of the logic element.

11. The method for checking the logic circuit of claim 9 wherein said transition time measuring step includes measuring total capacitance Cout of loads driven by the logic element, and calculating the rising transition time $t_r$ or the falling transition time $t_f$ of the signal generated by the logic element by the following formula using the measured Cout:

$$t_r=tx+kx\times Cout$$

where, tx and kx are parameters which change by the input capacitance Cin of logic element 12 as follows:

$tx=t1, kx=k1$:    $0<Cin<C1$
$tx=t2, kx=k2$:    $C1<Cin<C2$
$tx=t3, kx=k3$:    $C2<Cin<C3$
.
.
.
$tx=ti, kx=ki$:    $Ci_{-1}<Cin<Ci$
.
.
.
$tx=tn, kx=kn$:    $Cn<Cin$.

12. The method for checking the logic circuit of claim 9 wherein said transition time measuring step includes measuring total capacitance Cout of loads driven by the logic element and a drive coefficient K of the logic element in the precedent stage, and calculating rising transition time $t_r$ or the falling transition time $t_f$ of the signal generated by the logic element by the following formula using the measured Cout and drive coefficient K:

$$t_r=tx+kx\times Cout\times K$$

where, tx and kx are parameters which change by the input capacitance Cin of logic element 12 as follows:

$$tx = t1, kx = k1: \quad 0 < Cin < C1$$
$$tx = t2, kx = k2: \quad C1 < Cin < C2$$
$$tx = t3, kx = k3: \quad C2 < Cin < C3$$
$$\cdot$$
$$\cdot$$
$$\cdot$$
$$tx = ti, kx = ki: \quad C_{i-1} < Cin < Ci$$
$$\cdot$$
$$\cdot$$
$$\cdot$$
$$tx = tn, kx = kn: \quad Cn < Cin$$

13. The method for checking the logic circuit of claim 9, further comprising the step of:

changing the maximum allowable, DUTYMAX, into an appropriate value in response to whether a signal line driven by the logic element is a signal line data or a clock signal line.

14. A method for checking the effects of hot carriers on a logic circuit, the logic circuit including a plurality of signal lines and a capacitor and a load connected to each signal line, and a logic element coupled to the plurality of signal lines, said method comprising the steps of:

measuring capacitances Ci and Cpi of each load driven by the logic element;

calculating a total capacitance Cout ($\Sigma Ci + \Sigma Cpi$);

comparing said calculated Cout with maximum allowable capacitance Cmax;

measuring rising transition time $t_r$ or falling transition time $t_f$ of a signal generated by the logic element;

calculating a ratio (DUTY) of rising transition time $t_r$ or falling transition time $t_f$ or falling transition time $t_f$ and an operation period T of the signal; and comparing said DUTY with maximum allowable duty (DUTYMAX) for logic elements where Cout exceeds the maximum allowable capacitance Cmax;

wherein, if a comparison result is DUTY<DUTYMAX, it is judged that hot carriers have a small effect on the logic element and if the comparison result is DUTY>DUTYMAX, it is judged that hot carriers have a large effect on the logic element.

15. A method for checking the effects of hot carriers on a logic circuit, the logic circuit including a logic element coupled to a signal line, said method comprising the steps of:

measuring a rising transition time $t_{ri}$ and a falling transition time tfi of a signal applied to the signal line;

calculating the total rising transition time $\Sigma t_{ri}$;

calculating the total falling transition time $\Sigma t_{fi}$;

measuring a period T of the signal directly or assigning value of period T of a predetermined signal;

calculating DUTY by a following formula:

$$DUTY = (\Sigma t_{ri} + \Sigma t_{fi})/2T; \text{ and}$$

comparing DUTY with a specific maximum duty DUTYMAX of the logic element;

wherein, if a comparison result is DUTY<DUTYMAX, it is judged that hot carriers have a small effect on the logic element and if the comparison result is DUTY>DUTYMAX, it is judged that hot carriers have a large effect on the logic element.

16. A method for checking the effects of hot carriers on a logic circuit, the logic circuit including a logic element coupled to a plurality of loads by a signal line, said method comprising steps of:

measuring respective capacitances Ci and Cpi of the loads of the logic element;

calculating total capacitance Cout ($\Sigma Ci + \Sigma Cpi$) of the plurality of loads;

comparing said calculated Cout with maximum allowable capacitance Cmax;

measuring $t_{ri}$ and $t_{fi}$ of a signal applied to the signal line;

measuring total rising transition time $\Sigma t_{ri}$;

measuring total falling transition time $\Sigma t_{fi}$;

measuring a period T of the signal or assigning a value of period T of a predetermined signal;

calculating DUTY by a following formula:

$$DUTY = (\Sigma[t_{ri}] + \Sigma[t_{fi}])/2T;$$

comparing DUTY with a specific maximum duty DUTYMAX of the logic element;

wherein, if a comparison result is DUTY<DUTYMAX, it is judged that hot carriers give a small effect on the logic element and if the comparison result is DUTY>DUTYMAX, it is judged that hot carriers give a large effect on the logic element.

* * * * *

UNITED STATES PATENT AND TRADEMARK OFFICE
CERTIFICATE OF CORRECTION

PATENT NO.   : 5,671,148
DATED        : September 23, 1997
INVENTOR(S)  : Urano et al.

It is certified that error appears in the above-indentified patent and that said Letters Patent is hereby corrected as shown below:

Column 7, Line 36, after "duty" insert --DUTYMAX,--;

Column 9, Line 59, after "time" insert --$t_r$--;

Column 10, Line 1, after "checking" insert --the--;

Line 5, change "calculates" to --calculating--;

Column 11, Line 16, after "allowable" insert --duty,--.

Signed and Sealed this

Third Day of February, 1998

Attest:

BRUCE LEHMAN

Attesting Officer     Commissioner of Patents and Trademarks